(12) United States Patent
Fischer et al.

(10) Patent No.: US 9,598,763 B2
(45) Date of Patent: Mar. 21, 2017

(54) PISTON RING FOR INTERNAL COMBUSTION ENGINES

(75) Inventors: Manfred Fischer, Leichlingen (DE); Ralf Lammers, Wermelskirchen (DE); Christiane Bauer, Burscheid (DE); Steffen Hoppe, Overath (DE)

(73) Assignee: Federal-Mogul Burscheid GmbH, Burscheid (DE)

( * ) Notice: Subject to any disclaimer, the term of this patent is extended or adjusted under 35 U.S.C. 154(b) by 1033 days.

(21) Appl. No.: 12/444,187

(22) PCT Filed: Oct. 1, 2007

(86) PCT No.: PCT/EP2007/060356
§ 371 (c)(1),
(2), (4) Date: Apr. 3, 2009

(87) PCT Pub. No.: WO2008/040694
PCT Pub. Date: Apr. 10, 2008

(65) Prior Publication Data
US 2010/0044968 A1 Feb. 25, 2010

(30) Foreign Application Priority Data

Oct. 4, 2006 (DE) ........................ 10 2006 046 917

(51) Int. Cl.
*C23C 28/00* (2006.01)
*C23C 30/00* (2006.01)
(Continued)

(52) U.S. Cl.
CPC ........ *C23C 14/0641* (2013.01); *C23C 28/044* (2013.01); *C23C 28/42* (2013.01); *F16J 9/26* (2013.01)

(58) Field of Classification Search
CPC ............ F16J 9/00; F16J 9/26; C23C 14/0641; C23C 28/044; C23C 28/42; C23C 28/347
(Continued)

(56) References Cited

U.S. PATENT DOCUMENTS 4,284,687 A 8/1981 Dreyer et al.
4,554,201 A 11/1985 Andreev et al.
(Continued)

FOREIGN PATENT DOCUMENTS

DE 2851584 A1 6/1980
DE 31 52 742 C2 C2 10/1983
(Continued)

OTHER PUBLICATIONS

Ulrich S et al: "Correlation between constitution, properties and machining performance of Tin/ZrN multilayers" Surface and Coatings Technology, Elsevier, Amsterdam, NL, Bd, 188-189, 1. Nov. 2004 (Nov. 1, 2004), Seiten 331-337, XP004622229 ISSN: 0257-8972 das ganze Dokument.
(Continued)

*Primary Examiner* — Nicholas L Foster
(74) *Attorney, Agent, or Firm* — Robert L. Stearns; Dickinson Wright, PLLC

(57) ABSTRACT

The invention relates to a piston ring which is produced from a carrier material, especially steel or a cast material. The piston ring has a wear-resistant coating from a periodic multilayer system, every periodicity consisting of at least two individual metal nitride layers. Adjacent individual layers within the periodicity have different metallic elements. The thickness of an individual layer is ≥15 nm.

18 Claims, 4 Drawing Sheets

Figure 1:
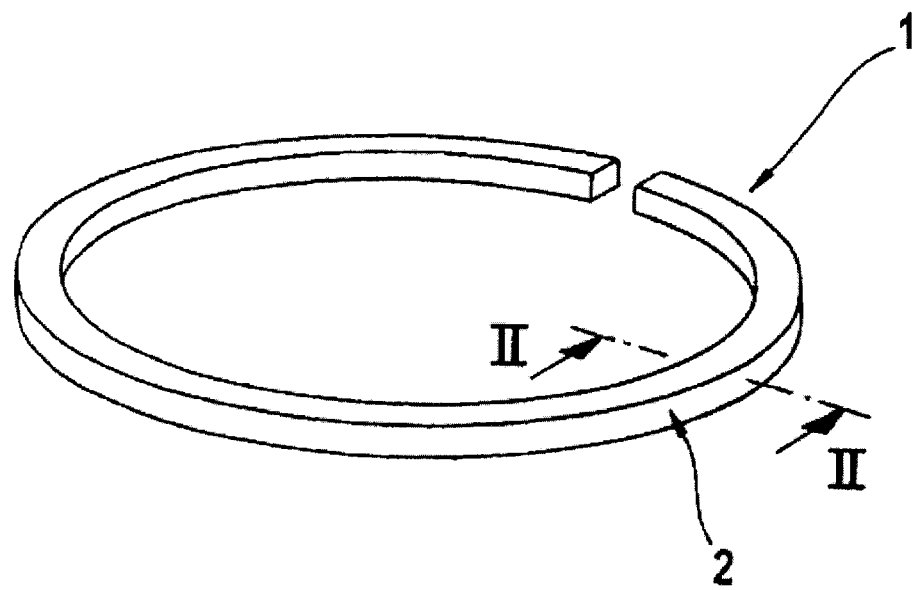

(51) Int. Cl.
  *C23C 14/06* (2006.01)
  *C23C 16/34* (2006.01)
  *F16J 9/26* (2006.01)
  *C23C 28/04* (2006.01)
(58) Field of Classification Search
  USPC .......................................... 277/440, 442–444
  See application file for complete search history.

(56) References Cited

U.S. PATENT DOCUMENTS

| | | | |
|---|---|---|---|
| 4,734,339 A * | 3/1988 | Schachner et al. | 428/701 |
| 4,945,640 A * | 8/1990 | Garg et al. | 30/350 |
| 5,593,234 A * | 1/1997 | Liston | 384/492 |
| 5,679,448 A * | 10/1997 | Kawata | 428/216 |
| 5,882,777 A * | 3/1999 | Kukino et al. | 428/216 |
| 6,139,022 A * | 10/2000 | Iwashita et al. | 277/443 |
| 7,008,688 B2 * | 3/2006 | Toihara | 428/216 |
| 7,060,345 B2 * | 6/2006 | Fukui et al. | 428/216 |
| 7,081,186 B2 | 7/2006 | Ehiasarian et al. | |
| 7,348,074 B2 * | 3/2008 | Derflinger | 428/699 |
| 8,142,912 B1 * | 3/2012 | Chang et al. | 428/698 |
| 2004/0191579 A1 * | 9/2004 | Ge | 428/698 |
| 2006/0222894 A1 * | 10/2006 | Bjormander et al. | 428/701 |
| 2007/0228664 A1 * | 10/2007 | Anand et al. | 277/399 |
| 2010/0044968 A1 | 2/2010 | Fischer et al. | |
| 2013/0003756 A1 | 1/2013 | Mitchell et al. | |
| 2013/0004756 A1 * | 1/2013 | Kennedy et al. | 428/216 |

FOREIGN PATENT DOCUMENTS

| | | |
|---|---|---|
| DE | 3512986 C2 | 10/1986 |
| DE | 4441136 A1 | 7/1995 |
| DE | 10061749 A1 | 6/2002 |
| DE | 102004028486 A1 | 12/2005 |
| DE | 102006046917 B3 | 2/2008 |
| JP | 2002256967 | 9/2002 |
| JP | 2005060810 A | 3/2005 |
| JP | 2005082822 | 3/2005 |
| JP | 2005187859 | 7/2005 |

OTHER PUBLICATIONS

Ducros et al: "Multilayered and nanolayered hard nitride thin films deposited by cathodic are evaporation. Part 1: Deposition, morphology and microstructure" Surface and Coatings Technology, Elsevier, Amsterdam, NL, Bd. 201, Nr. 1-2, Sep. 12, 2006, Seiten 136-142, XP005561272 ISSN: 0257-8972 das ganze Dokument.
Hovsepian P.E. et al: "Chromium nitride/niobium nitride superlatice coatings deposited by combined cathodic-arc/unbalanced magnetron technique" Surface and Coatings Technology 116-119 (1999) 727-734.
Purandare Y.P. et al: "Velocity effects on erosion-corrosion of CrN/NbN "superlatice" PVD coatings" Surface and Coatings Technology 201 (2006) 361-370.
Hovsepian P.E. et al: "Corrosion resistance of CrN/NbN superlattice caotings grown by various physical vapour deposition techniques" Thin Solid Films 488 (2005) 1-8.
"Superlattice" Wikipedia Encyclopedia Oct. 8, 2011, pp. 1-3.
Beporad E. et al.: Characterisation and wear properties of industrially produced nanoscaled CrN/NbN multilayer coating, Surface & Coatings Technology 2004, 188-189, S. 319-330.

Pecchio C. et al.: "Production of CrN/NbN superlattice coatings by cathode switching reactive cathodic arc evaporation",: Surface Treatment VI: 6th Int. Conference on Computer Methods and Experimental Measurements for Surface Treatment Effects, Crete, Greece, März 2003, S. 61-70.
Munz W-D. et al., Industrial scale manufactured superlattice hard PVD coatings, Surface Engineering 2001, 17(1), S. 15-27.
W.D. Sproul, Multilayer, multicomponent, and multiphase physical vapour deposition coatings for enhanced performance, J. Vac. Sci. Technol. (1994), Ai 2(4):1595-1601.
Hovesepian et al.: CrAIYN/CrN superlattice coatings deposited by the combined high power impulse magnetron sputtering / unbalanced magnetron sputtering technique in Surface and Coatings Technology 201 (2006) 4105-4110.
X Chu et al., Reactive unbalance magnetron sputter deposition of polycrystalline TiN/NbN superlattice coatings, in Surface and Coatings Tecl-mology 57 (1993) 13-18.
Barshilia Harish C and Rajam, KS (2003) Nanolayered TiN/NbN ilifultilayers as New Superhard Materials. In: International Conference on Advances in Surface Treatment: Research amp; Applications (SMT XVII amp; IFHTSE), Hyderabad, India; Paper 129.
Barshilia, Harish C and Rajam, KS (2003) Deposition of TiN/CrN hard superlattices by reactive d.c.1 3; magnetron sputtering. Bulletin of Material Science, 26 (2). pp. 233-237.
Barshilia, Harish C and Rajam, KS and Jain, Anjana (2003) Structure, hardness and thermal stability of nanolayered TiN/CrN multilayer coatings. Vacuum, 72 (3). pp. 241-248.
Barshilia, Harish C and Rajam, KS (2004) Structure and properties of reactive DC magnetron sputtered TiN/NbN hard superlattices. Surface and Coatings Technology, 183 (2amp;3). pp. 174-183.
Barshilia, Harish C and Surya Prakash, M and Aithu, Poojari and Rajam, KS (2004) Corrosion behavior of nanolayered TiNyNbN multilayer coatings prepared by reactive direct current magnetron sputtering process. Thin Solid Films, 460 (1-2). pp. 133-142.
Barshilia, Harish C and Surya Prakash, M and Anjana, Jain and Rajam, KS (2004) Structure, hardness and thermal stability of 17/11N and nanolayered TtAIN/CrN multilayer xFB01;lms. Vacuum, 77 (2). pp. 169-179.
Barshilia, Harish C and Rajam, KS and Gopinadhan, K and Chaudhary, SUJEET (2005) A comparative study on the structure and properties of nanolayered TiN/NbN and TiA1N/TiN multilayer coatings prepared by reactive direct current magnetron sputtering. Thin Solid Films, 503 . pp. 158-166.
Barshilia, Harish C and Selvakumar, N and Deepthi, B and Rajam, KS (2006) A comparative study of reactive direct current magnetron13; sputtered CrAIN and CrN coatings. Surface and Coatings Technology, 201 (6). pp. 2193-2201. ISSN 0257-8972.
Barshilia, Harish C and Deepthi, B and Rajam, KS (2006) Deposition and characterization of TiA1N/Si3N4 superhard13; nanocomposite coatings prepared by reactive direct current13; unbalanced magnetron sputtering. Vaccum, 81 (4). pp. 479-488.
Purdanre Y , Stack M.M. & Hovsepian P., A study of the erosion-cmosion of PVD CrN/NbN superlattice coating in aquous slurries, -Wear 259 (2005), 256-262.
Hovsepian P.E. et al: "Recent progress in large-scale production of nanoscale multi-layer/superlattice hard coating" Vacuum, 69 (2003), pp. 27-36.
Chu X. et al: "Deposition and properties of polycrystalline TiN/NbN superlattice coatings" J. Vac. Sci. Technol. A 10 (4) Jul./Aug. 1992 1604-9.
Czichos et al., Tribologie-Handbuch: Reibung und Verschleiβ, Wiesbaden: Vieweg, ISBN 3-528-06354-8, pp. 432-453.

* cited by examiner

CrN / ZrN multilayer coating as
wear-protection coating on a piston ring

CrN / TiN multilayer coating as
wear-protection coating on a piston ring

PISTON RING FOR INTERNAL COMBUSTION ENGINES

BACKGROUND OF THE INVENTION

1. Technical Field

The invention relates to a piston ring made of a carrier material, in particular of steel or a cast material, with a wear-resistant coating consisting of a periodic multilayer system, with each periodicity consisting of at least two individual layers of metal nitrides.

2. Related Art

The running surfaces of piston rings in internal combustion machines are subject to wear and tear during use. In order to minimize wear and tear, the running surfaces of the piston rings are provided with a protective layer.

From JP 2005-082822 AA and JP 2005-187859 AA a carrier material with a multilayer system has been known which features metal nitride layers. No reference can be found in either prior printed publication with regard to other metallic elements in the individual layers made of metal nitrides.

DE 44 41 136 A1 discloses a pressure ring for a piston of a piston cylinder arrangement of a piston combustion engine. The wear-resistant coating consists of a nitride such as CrN, $Cr_2N$, TiN, Ti/TiN or ZrN. The coating consists only of one single layer. No reference to a multilayer system can be found in DE 44 41 136 A1.

JP 2002-256967 AA discloses a gliding element with a wear-resistant coating. It mentions as an example a piston ring that features a layer on the basis of metal nitrides. In this prior printed publication, no references to any multilayer systems can be found either.

From DE 100 61 749 A1, a wear-resistant coating for piston rings in internal combustion engines has been known that essentially consists of chromium carbides, chromium, nickel and molybdenum. A powder consisting of these components is applied to the piston rings by means of high velocity oxygen fuel spraying. Although such protective layers showed good results with regard to wear and tear, crack resistance—in particular under great stress as it occurs in modern diesel engines—is not satisfactory.

In the area of tools subject to high stress such as, for example, cutting tools, it has long been known to provide multilayer systems as a protective layer. From DE 35 12 986 C2, a wear-resistant coating has been known whose individual layer thicknesses lie within a range of 0.5 to 40 nm. To the extent that a TiN layer is used as an individual layer, it is combined with an additional individual layer made of a carbide or a boride.

This multilayer technology has also found entry into the manufacture of piston rings. From JP 2005-060810 A, piston rings for internal combustion engines have been known that are equipped with a multilayer system whose individual layers have the same metallic component and that differ only in nitrogen contents. The layer thicknesses of the individual layers are indicated as <1 μm. The layers are applied by means of a PVD process, in particular of an electric arc process.

DE 10 2004 028 486 A1 describes a gliding component such as, for example, piston rings for internal combustion engines, that features a coating of several individual layers that consist alternatingly of chromium and chromium nitride. The chromium nitride layers may be made of CrN, $Cr_2N$ or mixtures thereof. To avoid any jagged transitions, the coating process is controlled in such a way that the individual chromium nitride layers each have a border of $Cr_2N$ and a core of CrN. Each individual layer is at least 0.01 μm thick. The maximum thickness amounts to 10 μm. Total thickness of the coating is indicated as 5 to 100 μm.

However, these known multilayer systems have the disadvantage that crack resistance is not satisfactory.

SUMMARY OF THE INVENTION AND ADVANTAGES

It is therefore the objective of the invention to provide a piston ring with a multilayer system that—with good wear resistance—is less prone to crack.

This task is solved with a piston ring in which adjoining individual layers within a periodicity contain different metallic elements and the thickness of an individual layer amounts to ≥15 nm.

It has turned out that a multilayer system made of nitride layers shows good wear resistance on the one hand and, on the other hand, is less prone to crack due to the use of different metals for the adjoining individual layers within the periodicity. Through the use of different metals for the metal nitrides, hardness and elasticity properties of the layer composition can be adjusted in such a way that distinct phase borders occur. If—as described in the state of the art—only one metal is used and only the nitrogen contents is varied, no such distinct phase borders will form that might exert a positive influence on the formation of cracks.

It has turned out that cracks—if they occur at all—extend only to the respective nearest phase border. At the most, such cracks may only lead to a partial detachment of parts of an individual layer. A detachment of the entire multilayer system has not been observed.

The life of piston rings with such a multilayer system is significantly longer than in the case of piston rings with a traditional individual layer or with a multilayer system that does consist of nitride layers but in which only the nitrogen contents is changed and the metal component stays the same.

Preferably the individual layers contain nitrides of at least one metal from the group of titanium (Ti), zirconium (Zr), hafnium (Hf), vanadium (V), niobium (Nb), tantalum (Ta), chromium (Cr), molybdenum (Mo) and wolfram (W).

In principle, all combinations of nitrides of the aforementioned metals are possible. This may involve stoichiometric phases or non-stoichiometric phases or mixtures thereof. For example, CrN is to be understood as one or several phases of the Cr—N system; this applies analogously to the other systems. Depending on the coating process, one or the other combination may perhaps be preferred.

Particularly preferred is the use of CrN for at least one individual layer of the periodicity. CrN may be combined in the multilayer system with the nitrides of all other metals of the aforementioned group.

Preferred combinations of individual layers are CrN/TiN, CrN/ZrN, or CrN/VN.

The periodicity may also have more than two individual layers, preferably up to four. Two individual layers are preferred in as much as the manufacturing expenditures significantly increase with the increasing number of individual layers per periodicity.

Preferably, one individual layer of the periodicity contains at least >0 to 15 weight percent, in particular 3 to 8 weight percent, of at least one of the doping elements aluminum, silicon or carbon. These doping elements cause the wear-resistant layers to have higher oxidation resistance and lower friction coefficients.

Preferably, the doping elements of adjoining individual layers will be different. The differences in the properties of the adjoining individual layers are further increased through the addition of the doping elements with the consequence that the differences in the material properties of the adjoining individual layers appear even more clearly at the phase borders which has a particularly favorable effect on the prevention of crack propagation vertically to the individual layers.

It is also possible that at least one of the individual layers of the periodicity contains nitrides of at least two metals from the group of Ti, Zr, Hf, V, Nb, Ta Cr, Mo and W, with adjoining individual layers differing in at least one metallic element.

Preferred metal combinations of the nitrides for at least one individual layer of the periodicity are Ti—Zr—N, Ti—Al—N, Cr—Si—N, Cr—Ti—N or Cr—V—N. The aforementioned metal combinations may also contain the aforementioned doping elements. The advantages of these metal combinations for the individual layers lie in the fact that the respective material properties can be varied and adjusted.

After one periodicity or several periodicities, at least one interlayer made of at least one of the metals Ti, Zr, Hf, V, Nb, Ta, Cr, Mo, W may be provided. The advantages of these interlayers lie in the fact that as ductile metals, they are able to divert or, respectively, to stop any crack propagations and to significantly increase the overall ductility of the multilayer combination to the effect that the overall internal stresses can be reduced. This is particularly important for the separation of wear-resistant coatings that are separated with a greater layer thickness to increase the usable life.

Preferably, at least one undercoating which may consist of at least one of the metals Ti, Zr, Hf, V, Nb, Ta, Cr, Mo, W is provided between the carrier material and the first individual layer.

One advantage lies in the fact that the otherwise common nitrating of the surface of the carrier material, in particular of the steel, may be dispensed with, thereby saving one work step.

This savings is further increased if the material of the undercoating is identical to the material of the interlayer or to the metal of an individual layer. In that case, the detachment process needs to be modified only via the composition of the process gas.

Preferred undercoating materials are chromium and titanium, particularly in the case of carrier materials made of steel because they show particularly good adhesion to steel materials.

The thickness of a periodicity preferably amounts to 30 nm to 1 μm, preferably 30 nm to 500 nm, particularly preferred 30 nm to 120 nm, and particularly preferred 60 nm to 120 nm. Preferably, the lower limit of the periodicity of the aforementioned value ranges lies at >30 nm.

It has turned out that with regard to wear resistance, there is an optimal value for the periodicity for any material combination of the individual layers.

Preferably, the thickness of an individual layer amounts to 15 nm to 150 nm.

The thickness of the multilayer system preferably amounts to >10 μm to 50 μm, in particularly to 10 μm to 30 μm. These thicknesses are below the thicknesses that are needed for layers according to the state of the art, for example for a single-layer chromium nitride layer in order to assure the same useful life. Reducing the thickness of the wear-resistant coating saves material and time during the manufacture of the coating.

Preferably, the multilayer system is applied by means of a PVD process.

The metal nitrides TiN, ZrN, VN, CrN and MoN can be applied particularly advantageously by means of the PVD processes.

The electric arc process is intended as the preferred process in order to apply the multilayer system.

The multilayer system may also be applied by means of a CVD process.

Particular use of such piston rings in accordance with the invention is intended for diesel engines and gasoline engines.

The wear-resistant coating is particularly suitable for compression rings and for oil rings.

THE DRAWINGS

Examples of embodiments of the inventions will be explained in detail in the following by way of the drawings.

Figure 2:
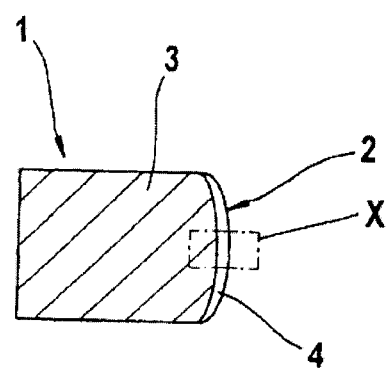
Figure 3:
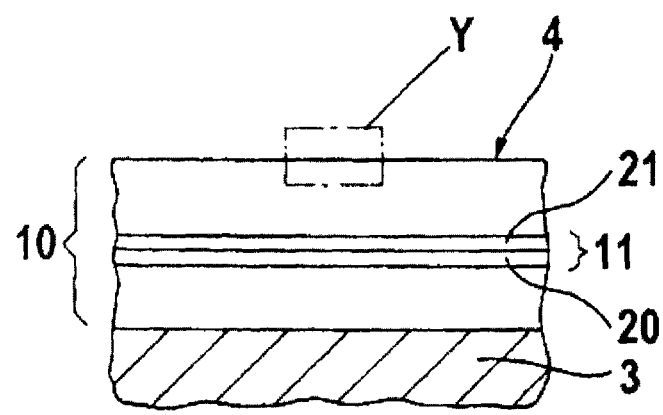
Figure 4:
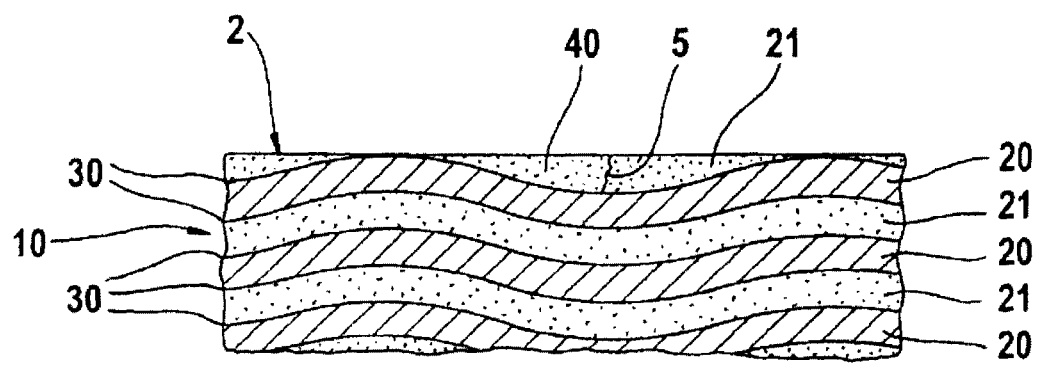
Figure 5A:
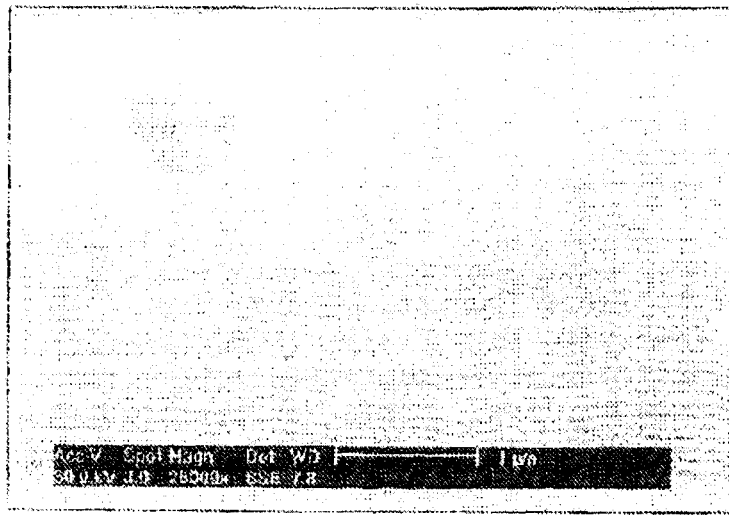
Figure 5B:
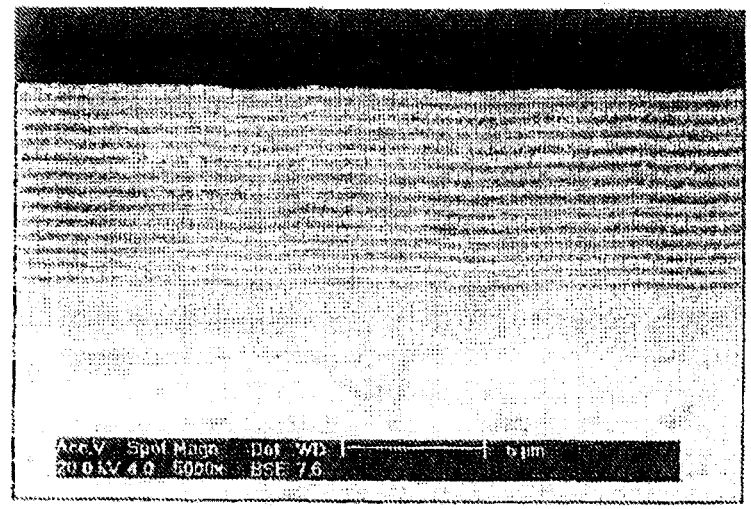
Figure 6:
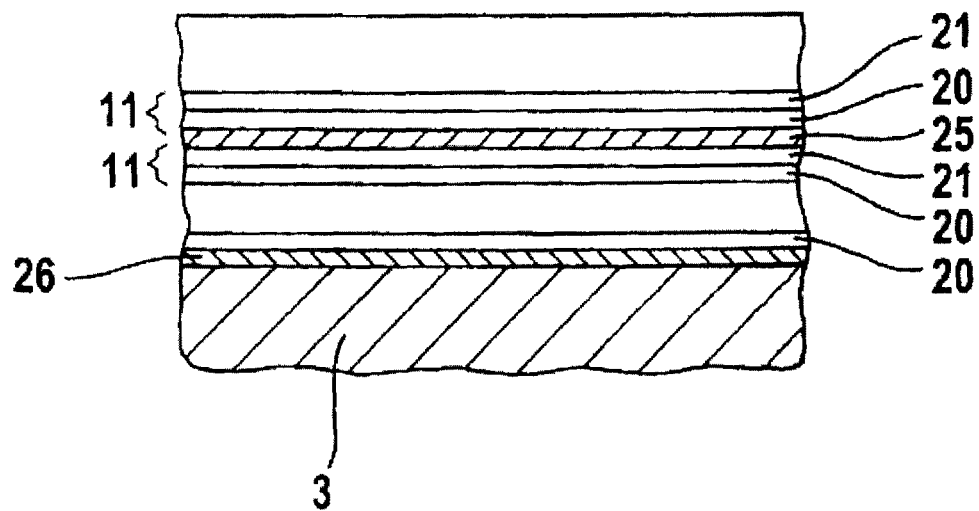

Shown are in:

FIG. 1 a piston ring in a perspective representation,

FIG. 2 a cut along line II-II through the piston ring shown in FIG. 1,

FIG. 3 an enlarged representation of detail X from FIG. 2,

FIG. 4 an enlarged representation of detail Y from FIG. 3,

FIG. 5*a* a scanning electron micrograph of a multilayer system of individual layers made of CrN/ZrN, FIG. 5*b* a scanning electron micrograph of a multilayer system of individual layers made of CrN/TiN, FIG. 6 a schematic representation of a multilayer system in accordance with an additional embodiment

DETAILED DESCRIPTION

A piston ring 1 is represented perspectively in FIG. 1. The exterior circumferential surface forms the running surface 2.

A cut along the line II-II through the piston ring 1 shown in FIG. 1 is shown in FIG. 2. The running surface 2 has a slightly spherical shape. The wear-resistant coating 4 deposited on the carrier material 3 reproduces this spherical shape.

An enlarged representation of detail X from FIG. 2 is represented in FIG. 3. The multilayer system 10 which is formed by a multitude of periodicities 11 is located on the carrier material 3. Each periodicity 11 consists of two individual layers 20, 21, with only one periodicity 11 having been drawn for the sake of clarity.

FIG. 4 shows an enlargement of detail Y from FIG. 3. Due to the unavoidable presence of irregularities in the thickness on the surface of the carrier material 3, a more or less distinct wave shape is formed for the individual layers, with the latter being smoothed out on the surface through a mechanical finishing process.

In FIG. 4, a crack 5 was drawn in the surface layer 21 which extends from the surface to the interior. This crack 5 ends at the first phase border 30. This phase border 30 prevents any further penetration of the crack 5 into the interior of the multilayer system. The more distinct the differences of the material properties between the individual layers 20 and 21 are, the more defined will be the deflection of the cracks.

If additional cracks are formed in the individual layer 21 within the island-shaped section 40, it may happen that this section will flake off. However, no further detachment of the underlying individual layer 20 will take place. The life of this coating and thus of the piston ring 1 is clearly increased due to the multilayer system 10 because in any event, cracks can spread only to the nearest phase border.

FIG. 5*a* shows a scanning electron micrograph in which the individual layers consist of CrN and ZrN.

FIG. 5b shows a scanning electron micrograph in which the individual layers consist of CrN and TiN.

The preferred metals of the metal nitrides are shown in the following Table 1 in a matrix. All metal nitride combinations for the adjacent individual layers are provided in accordance with the invention with the exception of the identity. The particularly preferred metal nitride combinations are marked by an X.

TABLE 1

(metal of the metal nitrides)

| System No.. | | Ti | Zr | Hf | V | Nb | Ta | Cr | Mo | W |
|---|---|---|---|---|---|---|---|---|---|---|
| 1 | Ti | | X | X | X | X | X | X | X | X |
| 2 | Zr | X | | X | X | X | X | X | X | X |
| 3 | Hf | X | X | | X | | | X | | |
| 4 | V | X | X | X | | X | X | X | X | X |
| 5 | Nb | X | X | | X | | | X | | |
| 6 | Ta | X | X | | X | | | X | | |
| 7 | Cr | X | X | X | X | X | X | | X | X |
| 8 | Mo | X | X | | X | | | X | | |
| 9 | W | X | X | | X | | | X | | |

System number 7 according to which a CrN layer is always involved within the periodicity as an individual layer is characterized by particularly good stability of the multilayer system. System numbers 1, 2 and 4 indicate metal nitride combinations that can be separated particularly favorably by means of the electric arc process.

EXAMPLE

For the purpose of wear protection, multilayer systems (with an undercoating of chromium) were deposited on piston rings in a reactive electric arc process. In this case, it involved nitrided piston rings made of a high-alloyed steel. The wear-resistant layers consisted of the individual layers CrN and ZrN that were deposited periodically. The overall layer thicknesses amounted to 12 µm to 12.8 µm. Three different periodicities were realized.

Overall layer thicknesses, periodicities and layer hardnesses are listed in Table 2. To check the wear resistance, model tests with lubricated reversing gliding stress were carried out with these piston rings. In each case, the counterbody consisted of a cylinder path segment made of a cast material (GOE 300, a material of the applicant); a synthetic ester without additives was used as a lubricant for time-lapse purposes.

The wear on the layer and on the counterbody as well as the friction coefficient can be optimized through suitable selection of the periodicities of the multilayer coats.

TABLE 2

| Layer | Thickness Mm | Periodicity | Layer Hardness | Wear of the Layer | Wear of the Counter Body | Friction Coefficient |
|---|---|---|---|---|---|---|
| CrN/ZrN | 12.5 | 233 nm | 2108 HV 0.1 | 3 µm | 59 µm | 0.085 |
| CrN/ZrN | 12 | 67 nm | 2231 HV 0.1 | 1 µm | 42.5 µm | 0.055 |
| CrN/ZrN | 12.8 | 107 nm | 2151 HV 0.1 | 0 µm | 33.5 µm | 0.050 |

FIG. 6 shows a schematic representation of a multilayer system 10 in accordance with an additional embodiment. An interlayer 25 is provided in each case between the periodicities 11. Also, an undercoating 26 is provided between the first individual layer and the carrier material. It is also possible to provide only one undercoating or only interlayers.

What is claimed is:

1. A piston ring made of a carrier material of steel or a cast material, and
with a wear-resistant coating made of a periodic multilayer system,
with each periodicity consisting of at least two individual layers of metal nitrides, wherein
adjoining layers within a periodicity have different metallic elements and that the thickness of an individual layer amounts to >15 nm, wherein
at least after one or several periodicities between two adjacent periodicities at least one interlayer and no layer other than the at least one interlayer is provided, wherein the at least one interlayer is made of at least one metal from the group of Ti, Zr, Hf, V, Nb, Ta, Cr, Mo and W, wherein
adjoining individual layers within a periodicity each include at least one doping element selected from the group consisting of aluminum, silicon, and carbon; and wherein
the adjoining individuals layers are not doped with the same element from the group consisting of aluminum, silicon, and carbon.

2. Piston ring in accordance with claim 1, wherein the individual layers contain nitrides of at least one metal from the group of Ti, Zr, Hf, V, Nb, Ta, Cr, Mo and W.

3. Piston ring in accordance with claim 1, wherein at least one individual layer of the periodicity is made of CrN.

4. Piston ring in accordance with claim 1, wherein each periodicity consists of individual layers made of CrN and TiN (CrN/TiN), CrN and ZrN (CrN/ZrN) or CrN and VN (CrN/VN).

5. Piston ring in accordance with claim 1, wherein at least one of the adjoining individual layers of the periodicity contains >0 to 15 weight percent of the at least one doping element selected from the group consisting of aluminum, silicon and carbon.

6. Piston ring in accordance with claim 1, wherein at least one of the individual layers of the periodicity contains nitrides of at least two metals from the group of Ti, Zr, Hf, V, Nb, Ta, Cr, Mo and W, with adjoining individual layers differing from each other in at least one metallic element.

7. Piston ring in accordance with claim 6, wherein at least one individual layer of the periodicity includes Ti—Zr—N, Ti—Al—N, Cr—Si—N, Cr—Zr—N, Cr—Ti—N or Cr—V—N.

8. Piston ring in accordance with claim 1, wherein at least one undercoating is provided between the carrier material and the wear-resistant layer.

9. Piston ring in accordance with claim 8, wherein the undercoating consists of at least one of the metals from the group of Ti, Zr, Hf, V, Nb, Ta, Cr, Mo and W.

10. Piston ring in accordance with claim 1, wherein the thickness of a periodicity amounts to 30 nm to 1 µm.

11. Piston ring in accordance with claim 10, wherein the thickness of an individual layer amounts to 15 nm to 150 nm.

12. Piston ring in accordance with claim 11, wherein the thickness of the multilayer system amounts to 10 μm to 50 μm.

13. Piston ring in accordance with claim 12, wherein the multilayer system is applied by means of a PVD process.

14. Piston ring in accordance with claim 12, wherein the multilayer system is applied by means of an electric arc process.

15. Piston ring in accordance with claim 12, wherein the multilayer system is applied by means of a CVD process.

16. Piston ring in accordance with claim 10, wherein the thickness of a periodicity amounts to 60 nm to 120 nm.

17. Piston ring in accordance with claim 12, wherein the thickness of the multilayer system amounts to 10 μm to 30 μm.

18. A piston ring made of a carrier material of steel or a cast material, and
- with a wear-resistant coating made of a periodic multilayer system,
- with each periodicity consisting of at least two individual layers of metal nitrides, wherein
- adjoining layers within a periodicity have different metallic elements and that the thickness of an individual layer amounts to ≥15 nm, wherein
- adjoining individual layers within a periodicity each include at least one doping element selected from the group consisting of aluminum, silicon, and carbon; and wherein
- the adjoining individuals layers are not doped with the same element from the group consisting of aluminum, silicon, and carbon.

* * * * *